US010217507B2

(12) United States Patent
Bringivijayaraghavan et al.

(10) Patent No.: US 10,217,507 B2
(45) Date of Patent: Feb. 26, 2019

(54) BENDING CIRCUIT FOR STATIC RANDOM ACCESS MEMORY (SRAM) SELF-TIMER

(71) Applicant: GLOBALFOUNDRIES INC., Grand Cayman (KY)

(72) Inventors: Venkatraghavan Bringivijayaraghavan, Cheyyar (IN); Sreejith Chidambaran, Thodupuzha (IN); Igor Arsovski, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 108 days.

(21) Appl. No.: 15/345,544

(22) Filed: Nov. 8, 2016

(65) Prior Publication Data

US 2018/0130521 A1    May 10, 2018

(51) Int. Cl.
  *G11C 11/00*    (2006.01)
  *G11C 11/419*   (2006.01)
  *G11C 7/22*     (2006.01)

(52) U.S. Cl.
  CPC ............. *G11C 11/419* (2013.01); *G11C 7/22* (2013.01)

(58) Field of Classification Search
  CPC ................................ G11C 11/419; G11C 7/22
  USPC ........................................................ 365/156
  See application file for complete search history.

(56) References Cited

U.S. PATENT DOCUMENTS

| | | | | |
|---|---|---|---|---|
| 5,355,343 A | * | 10/1994 | Shu ........................ | G11C 7/12 365/189.11 |
| 5,644,546 A | * | 7/1997 | Furumochi ............ | G11C 5/143 365/189.09 |
| 5,825,691 A | * | 10/1998 | McClure ................. | G11C 7/14 365/189.16 |
| 5,864,696 A | * | 1/1999 | McClure ................. | G11C 7/22 711/167 |
| 5,914,908 A | * | 6/1999 | Pinkham ................ | G11C 5/145 327/589 |
| 5,964,884 A | * | 10/1999 | Partovi ............... | G06F 12/1054 711/167 |
| 8,233,337 B2 | | 7/2012 | Arsovski et al. | |
| 8,982,651 B2 | | 3/2015 | Grover et al. | |
| 9,053,257 B2 | | 6/2015 | Schreiber et al. | |

(Continued)

FOREIGN PATENT DOCUMENTS

CN    103843065    6/2014

OTHER PUBLICATIONS

Examination Report dated Feb. 13, 2018 in related TW Application No. 106110780, 9 pages.

*Primary Examiner* — Viet Q Nguyen
(74) *Attorney, Agent, or Firm* — Anthony Canale; Andrew M. Calderon; Roberts Mlotkowski Safran Cole & Calderon, P.C.

(57) ABSTRACT

The present disclosure relates to a circuit, including a first transistor with a drain connected to a capacitor, a gate connected to an input of an inverter and a source connected to ground, a second transistor with a drain connected to the capacitor and a gate connected to the input of the inverter, a third transistor with a source connected to an output of the inverter, a drain connected to a source of the second transistor, and a gate connected to the input of the inverter, and a fourth transistor with a source connected to the source of the third transistor, a drain connected to ground, and a gate connected to the capacitor.

17 Claims, 4 Drawing Sheets

(56) References Cited

U.S. PATENT DOCUMENTS

| | | | |
|---|---|---|---|
| 2002/0145932 A1* | 10/2002 | Nguyen | G11C 7/22 365/227 |
| 2008/0080297 A1* | 4/2008 | Starnes | G11C 7/22 365/233.1 |
| 2009/0059686 A1* | 3/2009 | Sung | G11C 7/08 365/189.11 |
| 2010/0085823 A1* | 4/2010 | Carpenter | G11C 7/22 365/194 |
| 2015/0206576 A1 | 7/2015 | Gong et al. | |
| 2018/0025766 A1* | 1/2018 | Dietrich | G11C 11/2275 |
| 2018/0083629 A1* | 3/2018 | Bringivijayaraghavan | H03K 19/018507 |

* cited by examiner

US 10,217,507 B2

BENDING CIRCUIT FOR STATIC RANDOM ACCESS MEMORY (SRAM) SELF-TIMER

FIELD OF THE INVENTION

The present disclosure relates to a bending circuit for a static random access memory (SRAM) self-timer, and more particularly, to a bending circuit for a SRAM self-timer which improves the signal margins of the SRAM self-timer especially at lower voltages.

BACKGROUND

Memory devices are commonly employed as internal storage areas in a computing device or other electronic equipment. One specific type of memory used to store data in a computing device is random access memory (RAM). RAM is typically used as main memory in a computing environment, and is generally volatile in that once power is turned off, all data stored in the RAM is lost.

A static RAM (SRAM) is one example of RAM. SRAM has the advantage of holding data without a need for refreshing. A typical SRAM device includes an array of individual SRAM cells. Each SRAM cell is capable of storing a binary voltage value that represents a logical data bit (e.g., "0" or "1"). One configuration for an SRAM cell includes a pair of cross-coupled devices such as inverters. The inverters act as a latch that stores the data bit therein, so long as power is supplied to the memory array. In six-transistor (6T) cell, a pair of access transistors or pass gates (when activated by a word line) selectively couples the inverters to a pair of complementary bitlines (i.e., a bitline true and bitline complementary). Other SRAM cell designs may include a different number of transistors (e.g., 4T, 8T, etc.).

The design of SRAM cells has involved a compromise between the read and write functions of the memory array to maintain cell stability, read performance and write performance. In particular, the transistors which make up the cross-coupled latch must be weak enough to be over-driven during a write operation, while also strong enough to maintain their data value when driving a bitline during a read operation. The access transistors that connect the cross-coupled inverters to the true and complement bitlines affect both the stability and performance of the cell.

In one-port SRAM cells, a single pair of access transistors are used for both read and write access to the cell. The gates are driven to a digital value in order to switch the transistors between an "on" and "off" state. The optimization of an access for a write operation would drive the reduction of the on-resistance ($R_{on}$) for the device. On the other hand, the optimization of an access transistor for a read operation drives an increase in $R_{on}$ in order to isolate the cell from the bitline capacitance and prevents a cell disturbance.

This compromise between the read function and the write function for an SRAM becomes more of an issue as integrated circuits are scaled down in size. In particular, read and write margins of the SRAM cells, which measure how reliably the bits of the SRAM cells can be read from and written into, are reduced as the operation voltages of the integrated circuits are reduced with the down-scaling of the circuits. Reduced read and write margins may consequently cause errors in the respective read and write operations for the SRAM cells. Further, the transistors which make up the cross-coupled latch must be weak enough to be over-driven during a write operation, while also strong enough to maintain their data value while driving a bitline during a read operation.

SUMMARY

In an aspect of the disclosure, a circuit includes a first transistor with a drain connected to a capacitor, gate connected to an input of an inverter, and a source connected to ground, a second transistor with a drain connected to the capacitor and a gate connected to the input of the inverter, a third transistor with a source connected to an output of the inverter, a drain connected to a source of the second transistor, and a gate connected to the input of the inverter, and a fourth transistor with a source connected to the source of the third transistor, a drain connected to ground, and a gate connected to the capacitor.

In another aspect of the disclosure, a bending circuit of a memory circuit includes a first NFET transistor with a drain connected to a capacitor, a gate connected to an input of an inverter, and a source connected to ground, a first PFET transistor with a drain connected to the capacitor and a gate connected to the input of the inverter, and a second PFET transistor with a source connected to an output of the inverter, a drain connected to a source of the first PFET transistor, and a gate connected to the input of the inverter, and a third PFET transistor with a source connected to the source of the second PFET transistor, a drain connected to ground, and a gate connected to the capacitor, the input of the inverter is coupled to an input node through an input circuit.

In another aspect of the disclosure, a method of operation includes providing an input signal with a high signal value in a memory circuit, providing a voltage power supply to the memory circuit, charging a capacitor in the memory circuit in response to the input signal being provided with the high signal value, turning on a transistor in the memory circuit in response to the input signal being provided with the high signal value, and transitioning an output signal from a low signal value to the high signal value in the memory circuit in response to the input signal being provided with the high signal value.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a bending circuit for a static random access memory (SRAM) self-timer, and more particularly, to a bending circuit for a SRAM self-timer which improves the signal margins of the SRAM self-timer. In embodiments, the present disclosure relates to increasing self-timer delay of a SRAM at low voltage corners without substantially impacting self-time delay of the SRAM at high voltage corners. In embodiments, the bending circuit is used in the memory (SRAM) self-timer.

In embodiments, the bending circuit disclosed herein improves the signal margins of the SRAM at low-voltage corners. In embodiments, the bending circuit has a very small impact of self-timer delay at a high voltage corner (approximately 1.8%), and increases the self-timer delay at a low voltage corner (approximately 8%). Moreover, the present disclosure provides better signal margins at low voltage corners of the SRAM self-timer without adversely impacting the signal margins at the high voltage corners. For example, between 600-700 mV (e.g., low voltage corners), there is an increase in the self-timer delay of approximately 8%. Further, between 800-1000 mV (e.g., high voltage corners), there is an increase in the self-timer delay of approximately 1.8%. In contrast, in conventional systems, similar logic delays are introduced at both low voltage corners and high voltage corners (i.e., a same delay is introduced across the voltage spectrum). Thus, in such systems, there is no ability to fine tune the delay at a low voltage corner without also adversely impacting a high voltage corner (i.e., having a penalty in performance at high voltage corners).

Figure 1:
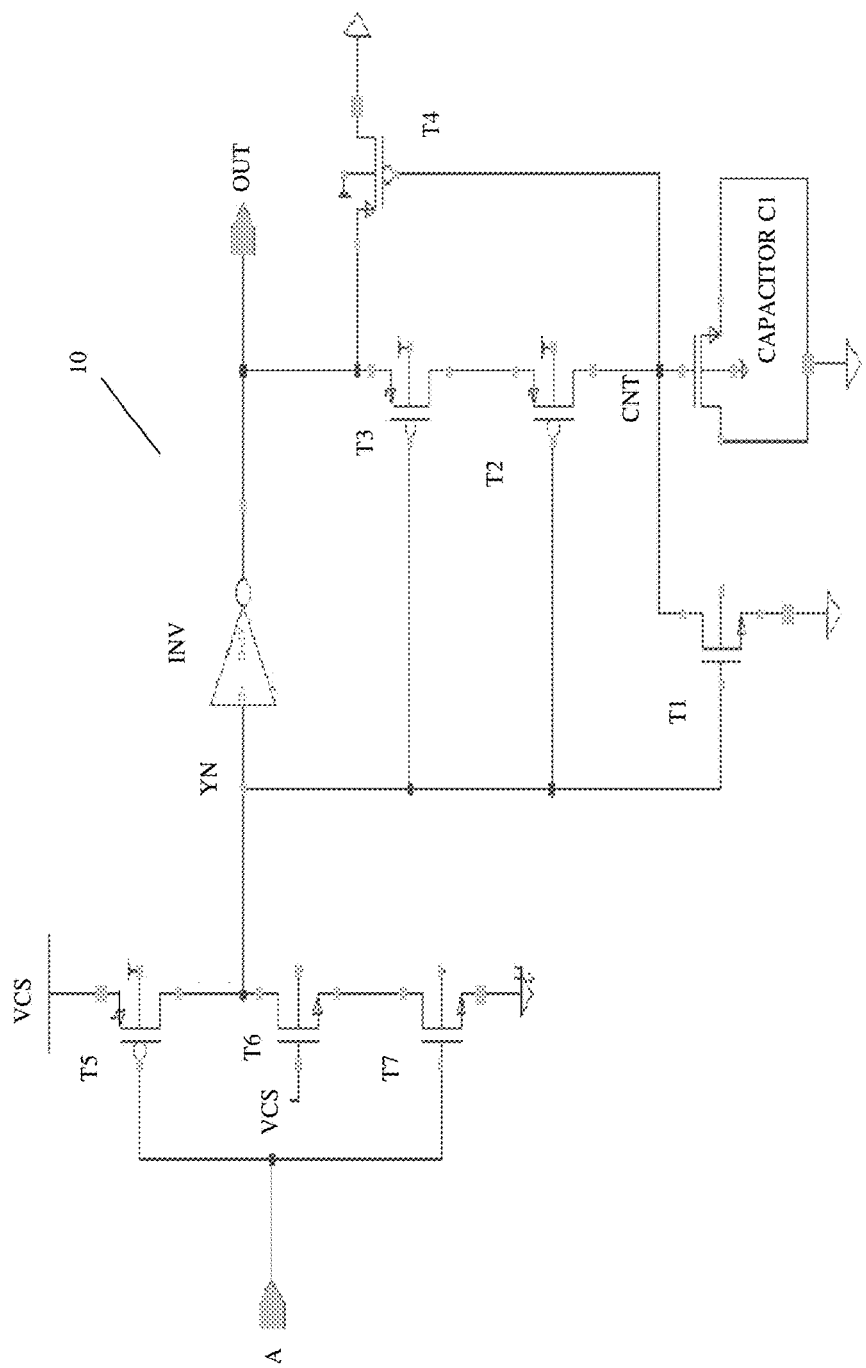
FIG. 1 shows a bending circuit in accordance with aspects of the present disclosure.

FIG. 1 shows a bending circuit in accordance with aspects of the present disclosure. In embodiments, the bending circuit 10 includes an input node A, a Yn node, a CNT node, transistors T1-T7, a capacitor C1, a voltage supply VCS, and an output node OUT. Further, as shown in FIG. 1, transistors T2, T3, T4, and T5 are PFET transistors while transistors T1, T6, and T7 are NFET transistors. Further, in FIG. 1, transistors T5, T6, and T7 are in series and transistors T3 and T2 are in series.

In embodiments, the bending circuit 10 of a memory circuit includes a transistor T1 with a drain connected to a capacitor C1 and a gate connected to an input of an inverter INV. A transistor T2 with a drain is connected to the capacitor C1 and a gate is connected to the input of the inverter INV. A transistor T3 with a source is connected to an output of the inverter INV, and a drain is connected to a source of the transistor T2 and gate is connected to the input of the inverter INV. A transistor T4 with a source is connected to the source of the transistor T3, a drain is connected to ground, and a gate connected to the capacitor C1. Further, the transistor T1 is a NFET transistor, and the transistor T2, the transistor T3, and the transistor T4 are PFET transistors.

In embodiments, the input of the inverter INV is coupled to an input node A through an input circuit. The input circuit comprises a transistor T5 with a source connected to a voltage power supply VCS and a gate connected to the input node A. The input circuit further comprises a transistor T6 with a drain connected to a drain of the transistor T5 and a gate connected to the voltage power supply VCS, and a transistor T7 with a drain connected to a source of the transistor T6 and a gate connected to the input node A.

In embodiments, the capacitor C1 comprises another transistor in which the gate is connected to the drain of the transistor T2 and the source of the another transistor is connected to the drain of the another transistor. The another transistor is a NFET transistor.

In embodiments, the inverter comprises at least two transistors T13 and T14. The transistors are a PFET transistor (e.g., transistor T13) and a NFET transistor (e.g., transistor T14). In operation, when the input of the inverter INV goes low, the capacitor C1 is charged through transistors T2 and T3, the transistor T4 will turn on, and the output node OUT transitions from low to high. A voltage power supply VCS is input to the bending circuit, and at a low voltage value of the voltage power supply VCS input, a self-timer delay of the memory circuit is increased. Further, at a high voltage value of the voltage power supply VCS input, a self-timer delay of the memory circuit is at a stable value.

In a more specific example of operation, when the input node A has a voltage value of "0", the capacitor C1 is fully discharged to ground via transistor T1. Further, transistor T4 will be turned off with a voltage value from drain to source (i.e., Vds) of "0". In another example of operation, when the input node A has a voltage value of "1", VCS is high, Yn node goes low (i.e., "0"), the capacitor C1 is charged, transistors T2, T3, and T4 will form a resistor-capacitor (RC) circuit, and the output node OUT transitions from low to high.

In embodiments, as the output node OUT transitions from low to high, transistor T4 will fight against a transistor T13 (i.e., T13 of FIG. 3) of inverter INV. In embodiments, the fight is between the voltage value of gate to source (i.e., Vgs) of transistor T13 against the voltage value of gate to source (i.e., Vgs) of transistor T4. In particular, as the voltage supply VCS increases, the Vgs of transistor T13 also increases and becomes stronger in a voltage value. In embodiments, the Vgs of transistor T4 is independent of the voltage supply VCS in the fighting region (i.e., Vgs of transistor T4 does not depend on the voltage supply VCS). Therefore, at high VCS, the Vgs of transistor T13 is much stronger (i.e., has a greater voltage value) than the Vgs of transistor T4. Thus, the Vgs of transistor T13 has less resistance than the Vgs of transistor T4 (and consequently, less delay). In contrast, at low VCS, the Vgs of transistor T13 is not as strong (i.e., has a lower voltage value) than the Vgs of transistor T4. Thus, in this situation, the Vgs of transistor has more resistance than the Vgs of transistor T13 (and consequently, more delay).

In embodiments, as the output node OUT transitions high (i.e., at approximately 85-90% of VCS), the CNT node is charged high to turn off transistor T4. Therefore, the fight is disabled and the output node OUT is allowed to fully transition to high (i.e., allow the voltage value to reach the rail).

Figure 2:
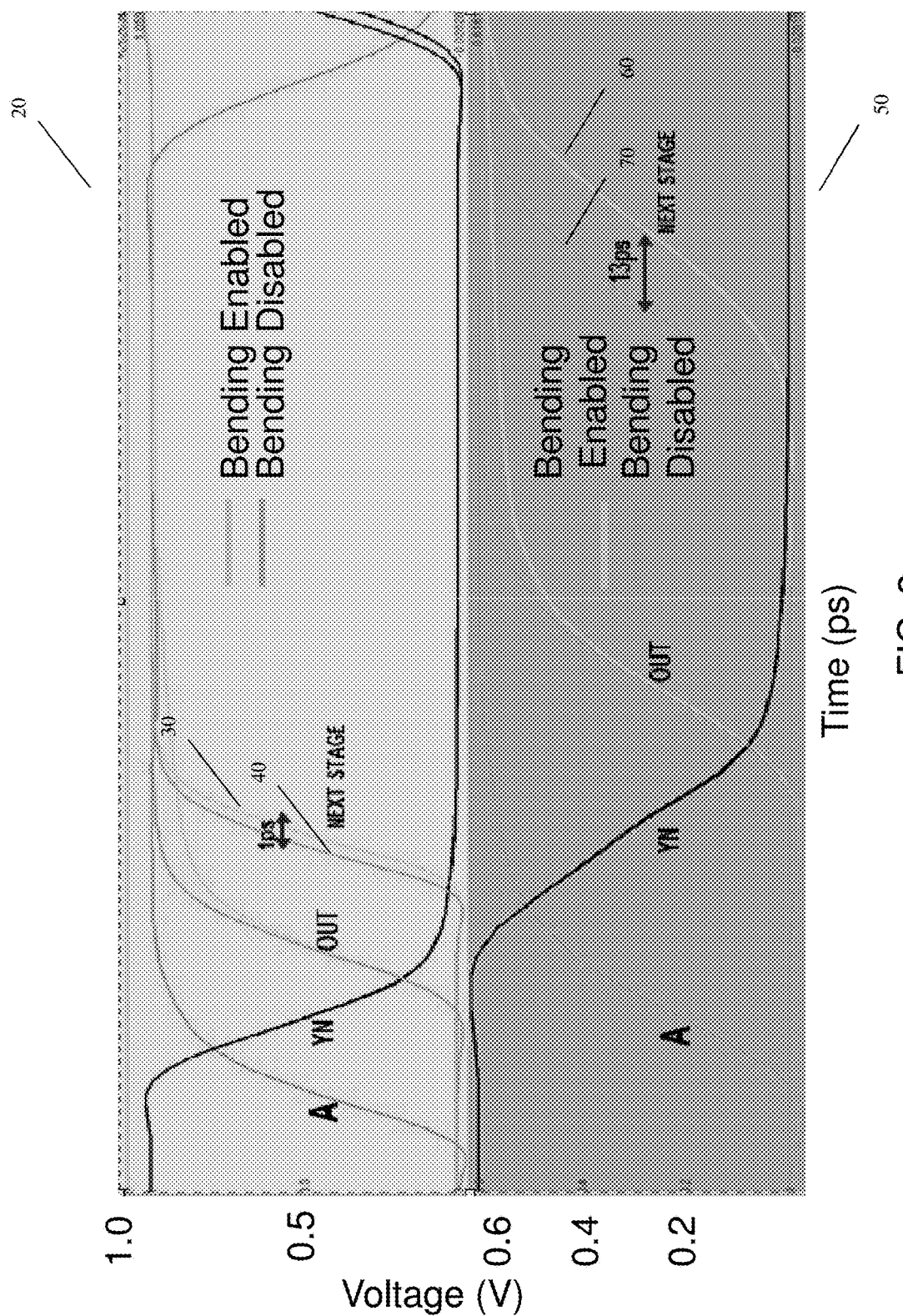
FIG. 2 shows graphs of the bending circuit in accordance with aspects of the present disclosure.

FIG. 2 shows graphs of the bending circuit in accordance with aspects of the present disclosure. In embodiments, at a graph 20 of the bending circuit, a time (in picoseconds) is plotted against voltage (V). In the graph 20 of the bending circuit, the bending circuit is enabled at plot 30 and the bending circuit is disabled at plot 40. Further, as shown in the graph 20 of the bending circuit, the voltage (V) of VCS is approximately at 1 V (i.e., approximately 1000 mV). Therefore, the delta delay between the bending circuit being enabled at plot 30 and the bending circuit being disabled at plot 40 is approximately 1 picosecond. Thus, the delta delay at a high voltage value of VCS (i.e., approximately 1000 mV) is only 1 picosecond. As shown in the graph 20 of the bending circuit, the self-timer delay is increased by 1 picosecond, which corresponds to a 1.8% improvement in self-timer delay at a high voltage corner.

In embodiments, at a graph 50 of the bending circuit, a time (in picoseconds) is plotted against voltage (V). In the graph 50 of the bending circuit, the bending circuit is enabled at plot 60 and the bending circuit is disabled at plot 70. Further, as shown in the graph 50 of the bending circuit, the voltage (V) of VCS is approximately at 0.6 V (i.e., approximately 600 mV). Therefore, the delta delay between the bending circuit being enabled at plot 60 and the bending circuit being disabled at plot 70 is approximately 13 picoseconds. Thus, the delta delay at a low voltage value of VCS (i.e., approximately 600 mV) is 13 picoseconds. As shown in the graph 50 of the bending circuit, the self-timer delay is increased by approximately 13 picoseconds, which corresponds to an 8% improvement in the self-timer delay at a low voltage corner.

Figure 3:
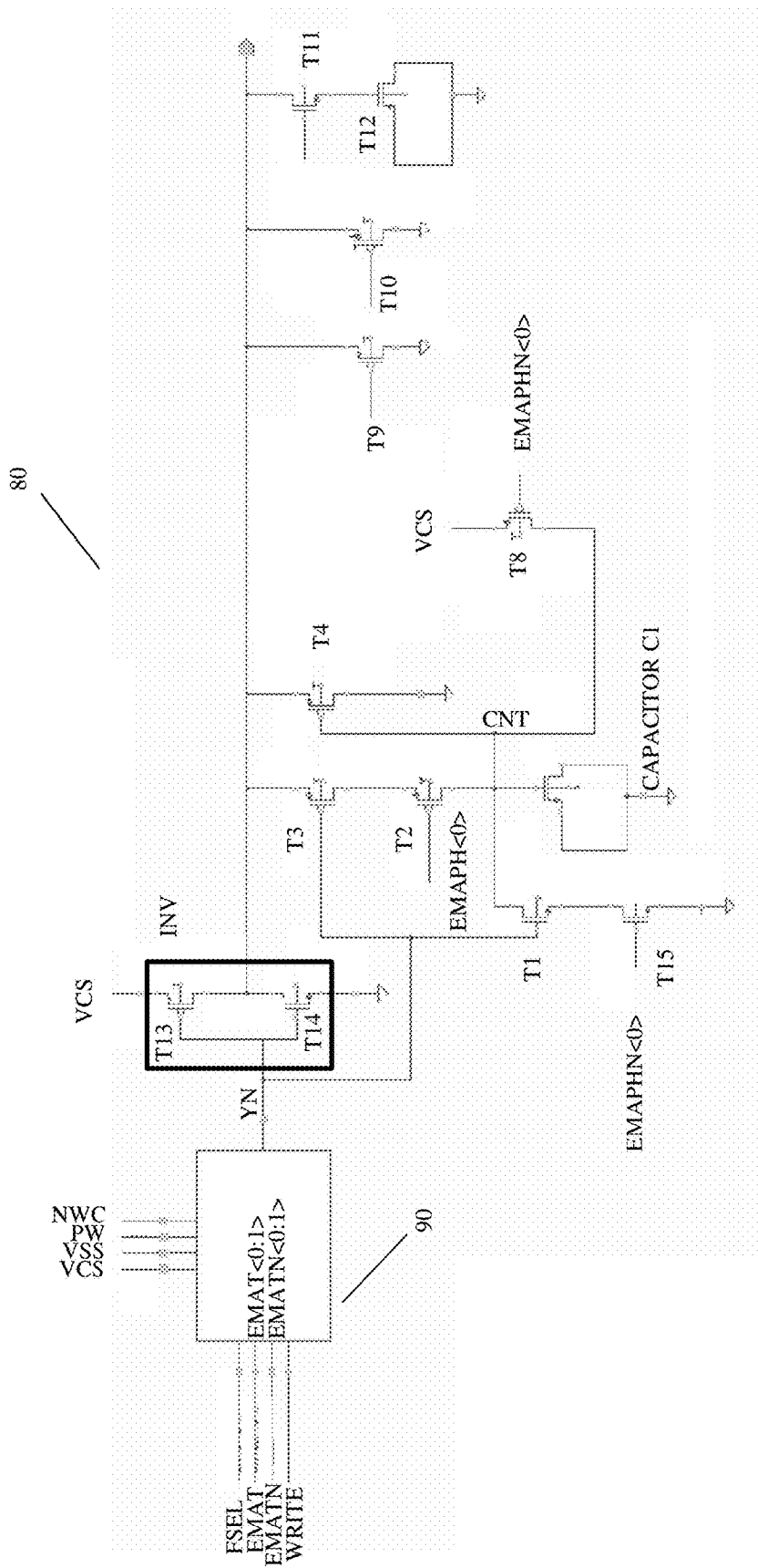
FIG. 3 shows the bending circuit in a SRAM self-timer in accordance with aspects of the present disclosure.

FIG. 3 shows an embodiment of the bending circuit in a SRAM self-timer in accordance with aspects of the present disclosure. In FIG. 3, a memory circuit 80 includes an input circuit 90, a bending pin signal EMAPH<0>, a bending pin negative signal EMAPHN<0>, transistors T1-T4 (which correspond to transistors T1-T4 in FIG. 1), transistors T8-T15, the capacitor C1 (which corresponds to the capacitor C1 in FIG. 1), and a voltage supply VCS. Further, the inverter INV (which corresponds to the inverter INV in FIG. 1) includes transistors T13 and T14. Further, as shown in FIG. 3, T2, T3, T4, T8, T9, T10, and T13 are PFET transistors while T1, T11, T12, T14, and T15 are NFET transistors.

In FIG. 3, in an example of operation, when EMAPH<0> is "1", bending is disabled. In this scenario, the capacitor C1 is fully discharged to ground via transistor T1. Further, transistor T4 will be turned off with a voltage value from drain to source (i.e., Vds) of "0". In another example of operation, when EMAPH<0> is "0", bending is enabled. In this scenario, VCS is high, Yn node goes low (i.e., "0"), the capacitor C1 is charged, and T2, T3, and T4 will form a resistor-capacitor (RC) circuit.

In embodiments, as a mimic word line transitions from low to high in FIG. 3, transistor T4 will fight against the transistor T13 of inverter INV. In embodiments, the fight is between the voltage value of gate to source (i.e., Vgs) of transistor T13 against the voltage value of gate to source (i.e., Vgs) of transistor T4. In particular, as the voltage supply VCS increases, the Vgs of transistor T13 also increases and becomes stronger in a voltage value. In embodiments, the Vgs of transistor T4 is independent of the voltage supply VCS in the fighting region (i.e., Vgs of transistor T4 does not depend on the voltage supply VCS). Therefore, at high VCS, the Vgs of transistor T13 is much stronger (i.e., has a greater voltage value) than the Vgs of transistor T4. Thus, the Vgs of transistor T13 has less resistance than the Vgs of transistor T4 (and consequently, less delay). In contrast, at low VCS, the Vgs of transistor T13 is not as strong (i.e., has a lower voltage value) than the Vgs of transistor T4. Thus, in this situation, the Vgs of transistor has more resistance than the Vgs of transistor T13 (and consequently, more delay).

In high performance memories (e.g., 2 GHz) such as register files, there is not that much logic depth. With less logic depth in high performance memories, it is challenging to obtain adequate bending at low voltage corners. In contrast, in embodiments of the present disclosure (i.e., FIG. 1 and FIG. 3), the self-timer of the memory is delayed at low voltages without much delay impact at high voltages. Thus, in embodiments of the present disclosure, the timing at low voltages can be pushed out (i.e., when bending is enabled) at low voltage corners without incurring much additional delay at high voltage corners.

Figure 4:
FIG. 4 shows a table of word lines to set timings and the corresponding improvement in delay in accordance with aspects of the present disclosure.

FIG. 4 shows a table of word lines to set and the corresponding improvement in delay in accordance with aspects of the present disclosure. In embodiments, a table 100 of wordlines to set (i.e., WL-SET) is specified in picoseconds. Further, the table 100 shows the delta delay of the memory circuit 80 in FIG. 3. In particular, at 600 mV, when EMAPH<0> is "0" (i.e., bending is enabled), the word line is set in 175 picoseconds. Further, at 600 mV, when EMPAH<0> is "1" (i.e., bending is disabled), the word line is set in 162 picoseconds. Thus, at 600 mV of VCS (i.e., low voltage corner), the self-timer delay of the memory circuit 80 increases 13 picoseconds, which corresponds to an increase of approximately 8%. In contrast, at 1000 mV, when EMAPH<0> is "0" (i.e., bending is enabled), the word line is set in 57 picoseconds. Further, at 1000 mV, when EMAPH<0> is "1" (i.e., bending is disabled), the word line is set in 56 picoseconds. Thus, at 1000 mV of VCS (i.e., high voltage corner), the self-time delay of the memory circuit 80 increases 1 picosecond, which corresponds to an increase of approximately 1.8%. Thus, as described above, the self-timer delay of the memory circuit 80 delays the self-timer by about 8% to improve the signal margin at low voltages while not introducing that much extra delay at high voltages (i.e., only 1.8% additional delay).

In embodiments, the bending circuit of the present disclosure improves yield. For example, in known systems, introducing logic delays increases self-timer delays at both low voltages and high voltages, which adversely impacts performance, in comparison to embodiments of the present disclosure.

In embodiments, the present disclosure may provide an input signal with a high signal value in a memory circuit. Further, a voltage power supply may be provided to the memory circuit. A capacitor in the memory circuit is charged in response to the input signal being provided with the high signal value. A transistor in the memory circuit is turned on in response to the input signal being provided with the high signal value. Finally, an output signal is transitioned from a low signal value to the high signal value in the memory circuit in response to the input signal being provided with the high signal value.

The bending circuit for a static random access memory (SRAM) of the present disclosure can be manufactured in a number of ways using a number of different tools. In general, though, the methodologies and tools are used to form structures with dimensions in the micrometer and nanometer scale. The methodologies, i.e., technologies, employed to manufacture the bending circuit for a static random access memory (SRAM) of the present disclosure have been adopted from integrated circuit (IC) technology. For example, the structures are built on wafers and are realized in films of material patterned by photolithographic processes on the top of a wafer. In particular, the fabrication of the word line voltage generator for a programmable memory array uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
   a first transistor with a drain connected to a capacitor, a gate connected to an input of an inverter, and a source connected to ground;
   a second transistor with a drain connected to the capacitor and a gate connected to the input of the inverter;
   a third transistor with a source connected to an output of the inverter, a drain connected to a source of the second transistor, and a gate connected to the input of the inverter; and
   a fourth transistor with a source connected to the source of the third transistor, a drain connected to ground, and a gate connected to the capacitor.

2. The circuit of claim 1, wherein the input of the inverter is coupled to an input node through an input circuit.

3. The circuit of claim 2, wherein the input circuit further comprises:
   a fifth transistor with a source connected to a voltage power supply and a gate connected to the input node;
   a sixth transistor with a drain connected to a drain of the fifth transistor and a gate connected to the voltage power supply; and
   a seventh transistor with a drain connected to a source of the sixth transistor, a gate connected to the input node, and a source connected to ground.

4. The circuit of claim 3, wherein the fifth transistor is a PFET transistor and the sixth transistor and the seventh transistor are NFET transistors.

5. The circuit of claim 1, wherein the capacitor comprises a transistor in which the gate is connected to the drain of the second transistor and the source of the transistor is connected to the drain of the transistor.

6. The circuit of claim 5, wherein the transistor is a NFET transistor.

7. The circuit of claim 1, wherein the inverter comprises at least two transistors.

8. The circuit of claim 7, wherein the at least two transistors comprises a PFET transistor and a NFET transistor.

9. The circuit of claim 1, wherein the first transistor is a NFET transistor.

10. The circuit of claim 1, wherein the second transistor, the third transistor, and the fourth transistor are PFET transistors.

11. The circuit of claim 1, wherein the circuit comprises a static random access memory (SRAM) circuit.

12. The circuit of claim 1, wherein when the input of the inverter goes low, the capacitor is charged, the fourth transistor will turn on, and the output node transitions from low to high.

13. The circuit of claim 1, further comprising a voltage power supply input to the circuit, and at a low voltage value of the voltage power supply input, a self-timer delay of the circuit is increased.

14. The circuit of claim 13, wherein at a high voltage value of the voltage power supply input, a self-timer delay of the circuit is at a stable value.

15. A bending circuit of a memory circuit, comprising:
   a first NFET transistor with a drain connected to a capacitor, a gate connected to an input of an inverter, and a source connected to ground;
   a first PFET transistor with a drain connected to the capacitor and a gate connected to the input of the inverter;
   a second PFET transistor with a source connected to an output of the inverter, a drain connected to a source of the first PFET transistor, and a gate connected to the input of the inverter;
   a third PFET transistor with a source connected to the source of the second PFET transistor, a drain connected to ground, and a gate connected to the capacitor,
   wherein the input of the inverter is coupled to an input node through an input circuit.

16. The bending circuit of claim 15, wherein when the input of the inverter goes low, the capacitor is charged, the third PFET transistor will turn on, and the output node transitions from low to high.

17. The bending circuit of claim 15, further comprising a voltage power supply input to the input circuit, and at a low voltage value of the voltage power supply input, a self-timer delay of the memory circuit is increased.

* * * * *